US008004441B1

(12) United States Patent
Beukema et al.

(10) Patent No.: US 8,004,441 B1
(45) Date of Patent: Aug. 23, 2011

(54) SMALL-AREA DIGITAL TO ANALOG CONVERTER BASED ON MASTER-SLAVE CONFIGURATION

(75) Inventors: Troy J. Beukema, Yorktown Heights, NY (US); Marcel A. Kossel, Rüschlikon (CH); Thomas Toifl, Rüschlikon (CH); Jonas Weiss, Rüschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/727,024

(22) Filed: Mar. 18, 2010

(51) Int. Cl.
H03M 1/66 (2006.01)

(52) U.S. Cl. .................... 341/144; 375/242

(58) Field of Classification Search .......... 341/118–144; 375/142, 145, 242; 327/19, 158, 161, 163, 327/151
See application file for complete search history.

(56) References Cited

U.S. PATENT DOCUMENTS

| | | | | |
|---|---|---|---|---|
| 4,764,750 A * | 8/1988 | Kawada | ................ | 341/122 |
| 5,146,225 A * | 9/1992 | Theus | ................ | 341/152 |
| 7,330,060 B2 * | 2/2008 | Abel et al. | ................ | 327/158 |
| 7,352,313 B2 * | 4/2008 | Abel et al. | ................ | 341/145 |
| 7,482,957 B2 | 1/2009 | Dai et al. | | |
| 7,671,768 B2 * | 3/2010 | De Ceuninck | ................ | 341/118 |

OTHER PUBLICATIONS

A. Lopez-Martin et al., "D/A Conversion Based on Multiple-Input Floating-Gate MOST," 1999, pp. 149-152, vol. 1, IEEE.
G. Serrano et al., "A Floating-Gate DAC Array," IEEE Proceedings of Int. Symp. Circuits and Systems (ISCAS), 2004, pp. 357-360, IEEE.
G. Serrano et al., "Investigating Programmable Floating-Gate Digita-To-Analog Converter As Single Element Arrays," 2002, pp. 75-77, IEEE.
L. Wong et al., "A 1-V CMOS D/A Converter with Multi-Input Floating-Gate MOSFET," IEEE Journal of Solid-State Circuits, Oct. 1999, pp. 1386-1390, vol. 34 No. 10, IEEE.
L. Wong et al., "A 0.9V 5MS/s CMOS D/A Converter with Multi-input Floating-gate MOS," IEEE Custom Integrated Circuits Conference, 1997, pp. 305-308, IEEE.

* cited by examiner

*Primary Examiner* — Lam T Mai
(74) *Attorney, Agent, or Firm* — Cantor Colburn LLP; Stephen Kaufman

(57) ABSTRACT

A digital-to-analog (DAC) converter that includes a plurality of dynamically operated slave digital-to-analog (DAC) converters, each having a switched current mirror and a storage capacitor, and a static master digital-to-analog (DAC) converter in communication with the plurality of dynamically operated slave DAC converters, that distributes a current to at least one of the plurality of slave DAC converters such that voltage across the storage capacitor of the at least one slave DAC converter controls the switch current mirror so that the at least one slave DAC converter outputs currents that are equivalent to digital codes applied to the static master DAC converter. A ring counter is used to periodically refresh the charges on the storage capacitors that are lost by leakage. In addition to the periodic updates, an end user may perform immediate updates of selected slave DACs if necessary, via the ring counter.

16 Claims, 11 Drawing Sheets

SMALL-AREA DIGITAL TO ANALOG CONVERTER BASED ON MASTER-SLAVE CONFIGURATION

BACKGROUND

The present invention relates to digital-to-analog converters ("DACs"), and more particularly to the operation of DACs in a master-slave configuration where the master DAC is a high-precision, static DAC driving many dynamically-operated slave DACs. This master-slave configuration preserves silicon area in high-density applications.

DACs are used in applications where an analog value (e.g. current or voltage) needs to be set by means of a digital code at the input of the DAC. The analog value may be used to determine an operation point of an analog circuit. The requirements for DACs are dependent on their application and may encompass features such as high speed, high accuracy and resolution, low power or small area.

A typical current-mode DAC ("IDAC") 100 is shown in FIG. 1. It consists of M identical static IDAC cells 101 that share a common memory block 102. A single IDAC consists of N binary weighted transistors 103 that are controlled by a code stored in the memory block 102. The binary weighted currents sum at the common output node and the resulting output current $I_0$ has a resolution of $2^{-N}$. The gates of the turned on transistors 103 are connected to $v_{ref}$ in order to keep them in a saturation region so that each transistor 103 can act as current source. The IDAC 100 shown in FIG. 1 is one example of many possible IDAC topologies. To assure linear operation across the entire current range, it might be necessary to replace the binary weights by thermometer-coded weights or a mixture of thermometer-coded most significant bits (MSBs) and binary coded least significant bits (LSBs).

From a surface area point of view, the typical IDAC 100 has at least two drawbacks that limit the integration density. First, each of the M identical static IDAC cells 101 needs N digital control lines. The total number of M×N control lines occupies a significant amount of wiring resources. Second, the area of a single M identical static IDAC cell 101 doubles with every additional bit of resolution. Since the area penalty scales with the factor M. Despite their robust and straight-forward design, M identical static IDAC cells 101 are not well suited for a high integration density.

SUMMARY

According to an embodiment of the present invention, a digital-to-analog converter is provided. The digital-to-analog (DAC) converter includes a plurality of dynamically operated slave digital-to-analog (DAC) converters, each having a switched current mirror and a storage capacitor, and a static master digital-to-analog (DAC) converter in communication with the plurality of dynamically operated slave DAC converters. The static master DAC is operable to distribute a current to at least one of the plurality of slave DAC converters such that voltage across the storage capacitor of the at least one slave DAC converter controls the switch current mirror so that the at least one slave DAC converter outputs currents that are equivalent to digital codes applied to the master DAC converter. A ring counter is used to periodically refresh the charges on the storage capacitors that are lost by leakage. In addition to the periodic updates, an end user may perform immediate updates of selected slave DACs if their respective output currents need to be changed in-between two successive update cycles, via the ring counter.

According to another embodiment of the present invention, a method for performing digital-to-analog conversion is provided.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

TECHNICAL EFFECTS

As a result of the summarized inventions, technically we have achieved a solution for reducing the area of digital-to-analog converters by dynamically operating distributed low-complexity DACs. The distributed small-area DACs consist of only a switched current mirror with storage capacitor whose voltage controls the output current that is equivalent to the digital input code of the centralized static DAC that programs the individual distributed DACs.

BRIEF DESCRIPTION OF SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An embodiment of the digital-to-analog converter ("DAC") according to the present invention involves a centralized, high-precision DAC that drives many distributed, dynamically-operated DACs with low-complexity and within a small area. The centralized DAC is termed master-DAC ("MDAC") and the distributed DACs are termed slave-DACs ("SDACs"). The token of a ring counter (i.e., a token generator) periodically selects the individual SDACs as well as the pertinent memory cells for an update or a periodic refreshing of the SDACs' storage capacitor that suffer from leakage through a storage capacitor or through switches feeding the storage capacitor.

Figure 2:
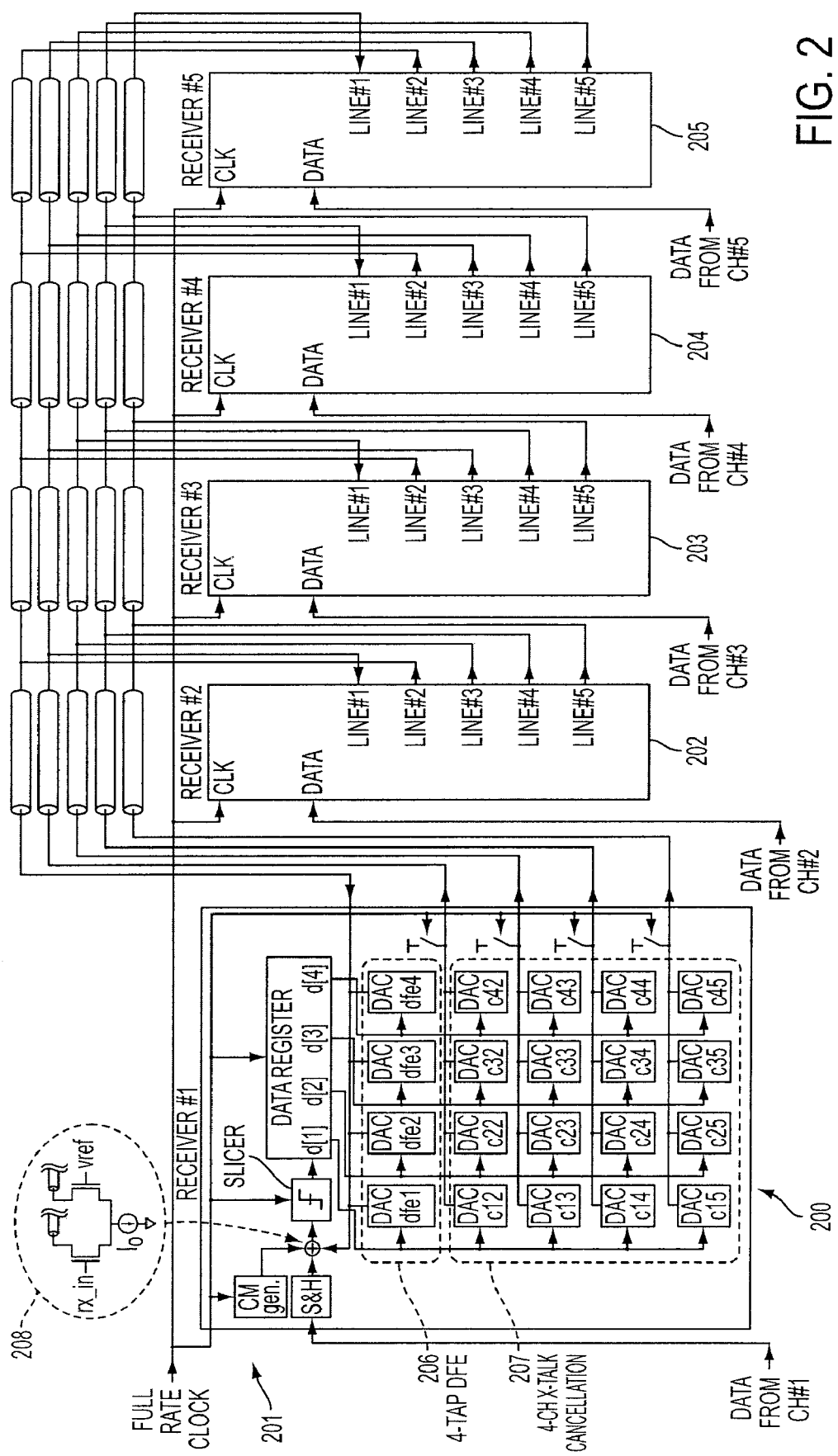
FIG. 2 is a diagram illustrating a wire line receiver front-end where DACs are used to adjust the coefficients of a decision-feedback-equalizer and a cross-talk canceller.

FIG. 2 is a diagram illustrating a wire line receiver frontend where DACs are used to adjust the coefficients of a decision-feedback-equalizer and a cross-talk canceller. As shown in FIG. 2, a wire line receiver front-end 200 includes five receiver channels 201 through 205. Each receiver channel 201 through 205 includes a four-tap decision feedback equalizer ("DFE") 206 and a cross-talk canceller 207 to combat four aggressors since each victim line is surrounded by four neighboring lines that could cause cross-talk. The fourtap DFE 206 and the cross-talk cancellor 207 each include a plurality of DACs. Each of the DACs in the DFE 206 and cross-talk canceller 207 feeds a current to a source-coupled logic circuit 208. The tail current $I_0$ of the source-coupled logic circuit 208 is equivalent to the corresponding DFE 206 or cross-talk canceller 207 coefficient and is provided by one of the current-mode DACs. The coefficient nomenclature, e.g., c35 is such that the 3 represents the data bit position in aggressor, and the 5 represents the victim line; and "dfe2" for example, represents DFE weight assigned to data bit #2.

Figure 1:
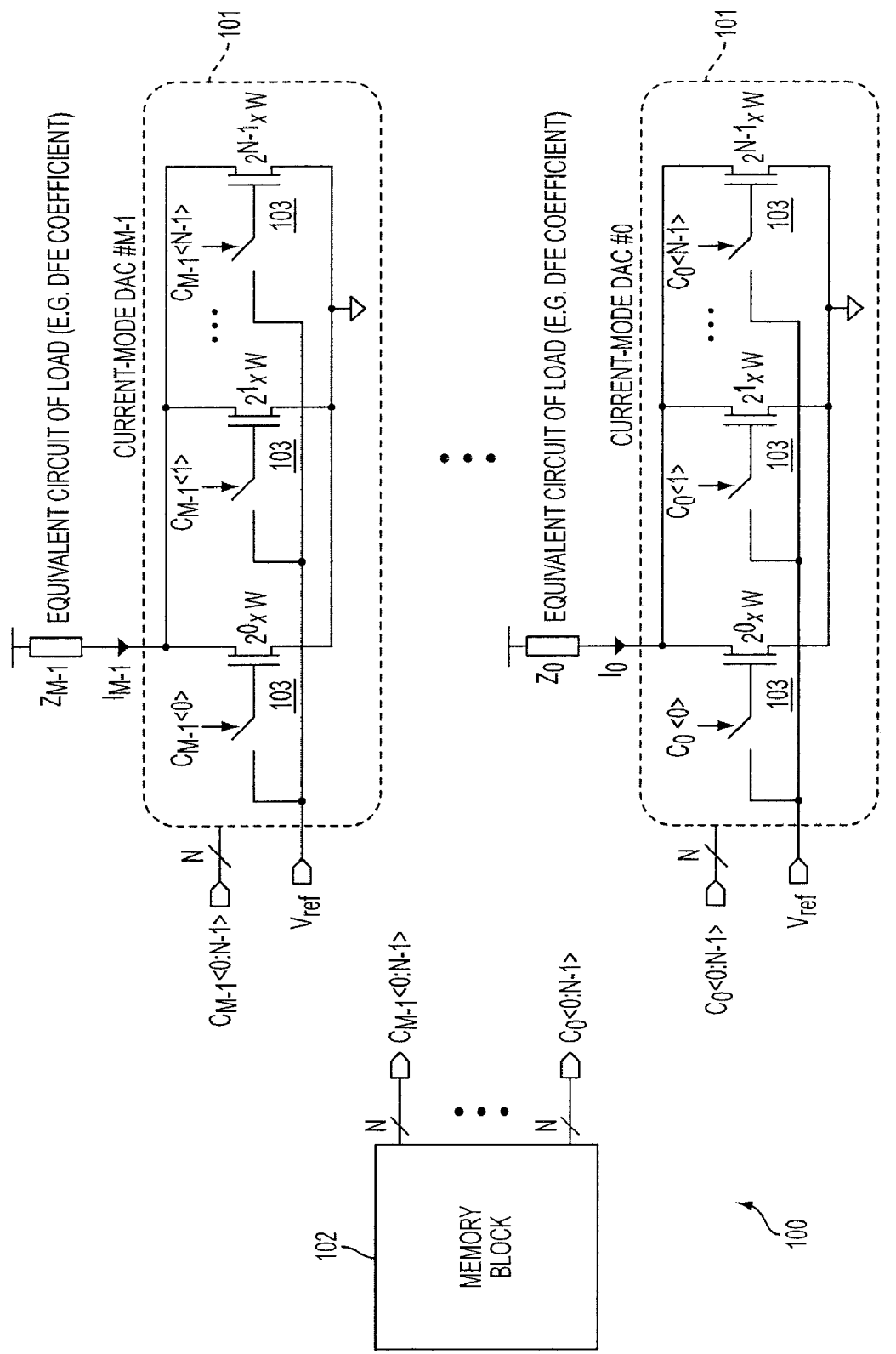
FIG. 1 is a diagram illustrating a typical static current-mode digital-to-analog converter consisting of M identical, binary-weighted IDAC cells that share a common memory block.

There are approximately 20 DACs per receiver channel 201 through 205 shown in FIG. 2. With increasing data rates, the design of decision-feedback equalizers and cross-talk cancellers becomes more and more demanding and complex in terms of the number of DFE taps or aggressors and also in terms of their resolution. As a consequence, future designs need more and more DACs to adjust all of these coefficients. Despite the shrinking feature sizes of modern process technologies, the area consumption of typical, static currentmode DACs poses a limiting factor to these kinds of applications. Embodiments of the present invention provide a DAC that allows a significant area reduction and hence it is possible to circumvent the limiting area-factor of typical DACs such as that shown in FIG. 1.

Figure 3:
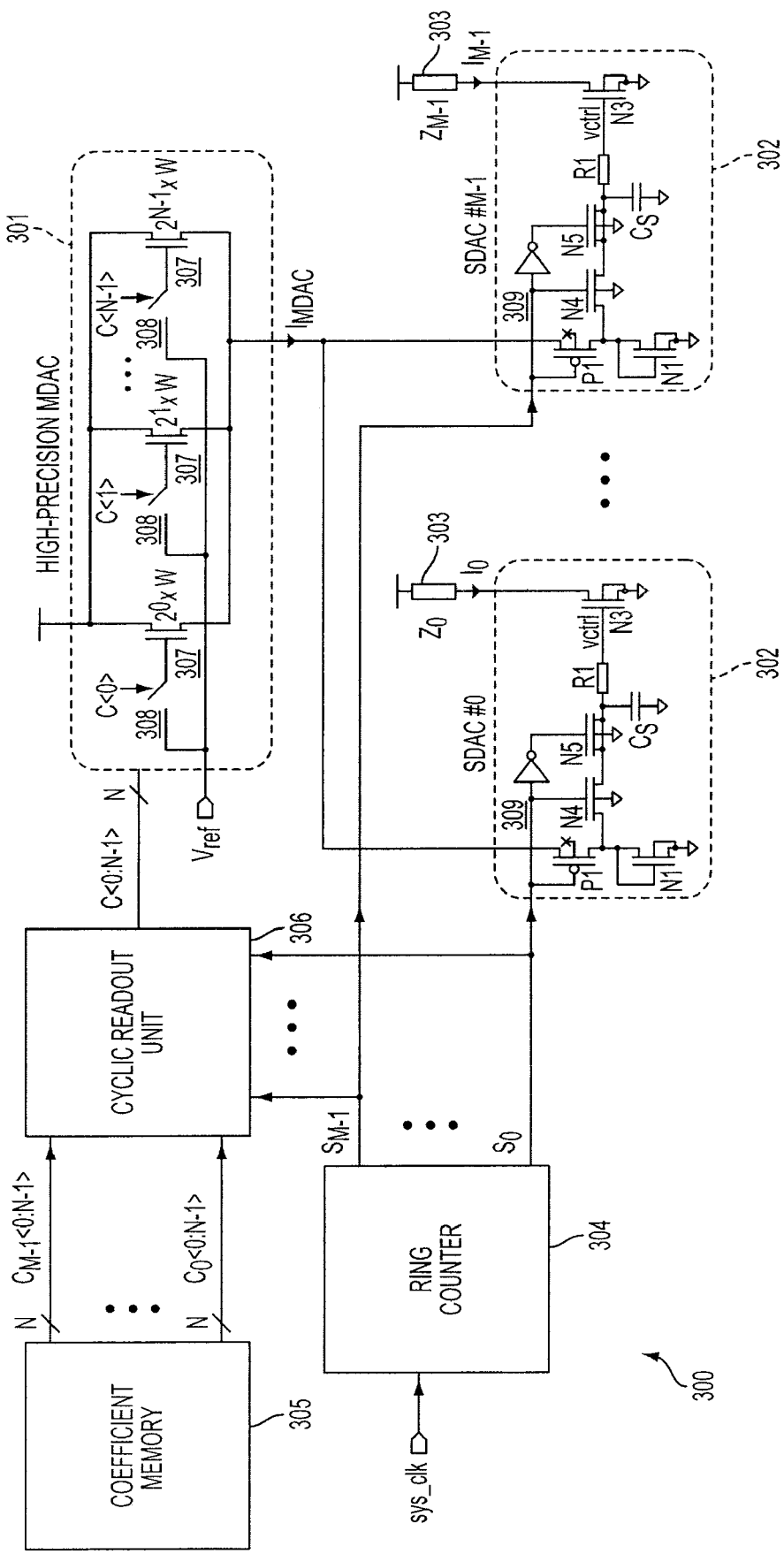
FIG. 3 is a diagram illustrating a DAC in a master-slave configuration that can be implemented within embodiments of the present invention.

FIG. 3 is a diagram illustrating a DAC in a master-slave configuration that can be implemented within embodiments of the present invention. As shown in FIG. 3, a DAC 300 includes a high-precision master digital-to-analog converter ("MDAC") 301, M slave digital-to-analog converters ("SDACs") 302 with equivalent load resistors 303, a ring counter 304, a coefficient memory 305 and a cyclic readout unit 306.

According to an embodiment of the present invention, the MDAC 301 is a static DAC and includes N binary weighted switching devices (e.g., transistors) 307 and switches 308. The MDAC 301 provides an output current $I_{MDAC}$ according to the digital programming code c<0:N−1>. The reference voltage $v_{ref}$ is chosen such that the transistors 307 are operated as current sources in the saturation region when the switches 308 are closed. According to another embodiment of the present invention, thermometer-coding may be used instead of binary weighting. The use of thermometer-coded transistors 307 would result in a more linear output current characteristic. However, please note that thermometer-coding requires larger silicon area and a higher number of control bits than binary weighting.

The programming code c<0:N−1> is provided by the cyclic readout unit 306 based on the token signals $s_0$ through $s_{M-1}$ of which only one signal carries the token at a time. The token, which is represented by a pulse, cyclically propagates through $s_0$-$s_{M-1}$ according to the input clock sys_clk of the ring counter 304. According to an embodiment of the present invention, the token allows the cyclic readout unit 306 to select the code c<0:N−1> out of M codes $c_0$<0:N−1> through $c_{M-1}$<0:N−1> stored in the coefficient memory 305 that belongs to the SDAC 302, which is currently selected by the same token signal as is provided to the cyclic readout unit 306.

According to an embodiment of the present invention, the SDACs 302 each include a switched current mirror (N1, N3), a pair of switches (e.g., Field effect transistors) P1, N4, and a RC-section (R1, $C_s$) with N1 being the diode-connected load for the MDAC 301 whose current $I_{MDAC}$ is mirrored in N3. A short-circuited transistor N5 is also provided and is used to counteract the charge injection from switch N4. When switch N4 turns off, half of its channel charges flow in equal measures to its drain and source nodes whereas charges injected in direction to N1 do not affect the operation of the SDAC 302, any charge injection towards the gate of N3 may lead to a jump in a control voltage $v_{ctrl}$ of N3 and hence to a significant change of the output current $I_0$. To prevent that half of the channel charges of switch N4 flow to the gate of current mirror N3, the short-circuited transistor N5 is located between N4 and N3. Each SDAC 302 also includes an inverter 309, due to the use of the inverter 309, N5 turns on when switch N4 turns off and vice versa. If the width of shortcircuited transistor N5 is approximately half of that of switch N4, short-circuited transistor N5 is able to absorb approximately half of N4's channel charges that would otherwise directly flow to the gate of N3 when switch N4 turns off.

During an on-state of switch N4, the storage capacitor G is charged or discharged to the voltage across the diode-connected transistor N1. This voltage is dependent on $I_{MPAC}$, which is a function of the code c<0:N−1> applied to the MDAC 301. To filter any ripples on the control voltage $v_{ctrl}$, resistor R1 is connected between the storage capacitor $C_s$ and the gate of N3 and forms an RC-low pass filter together with the gate-source capacitance of N3. An operation of SDACs 302 will now be discussed below with reference to FIG. 4.

Figure 4:
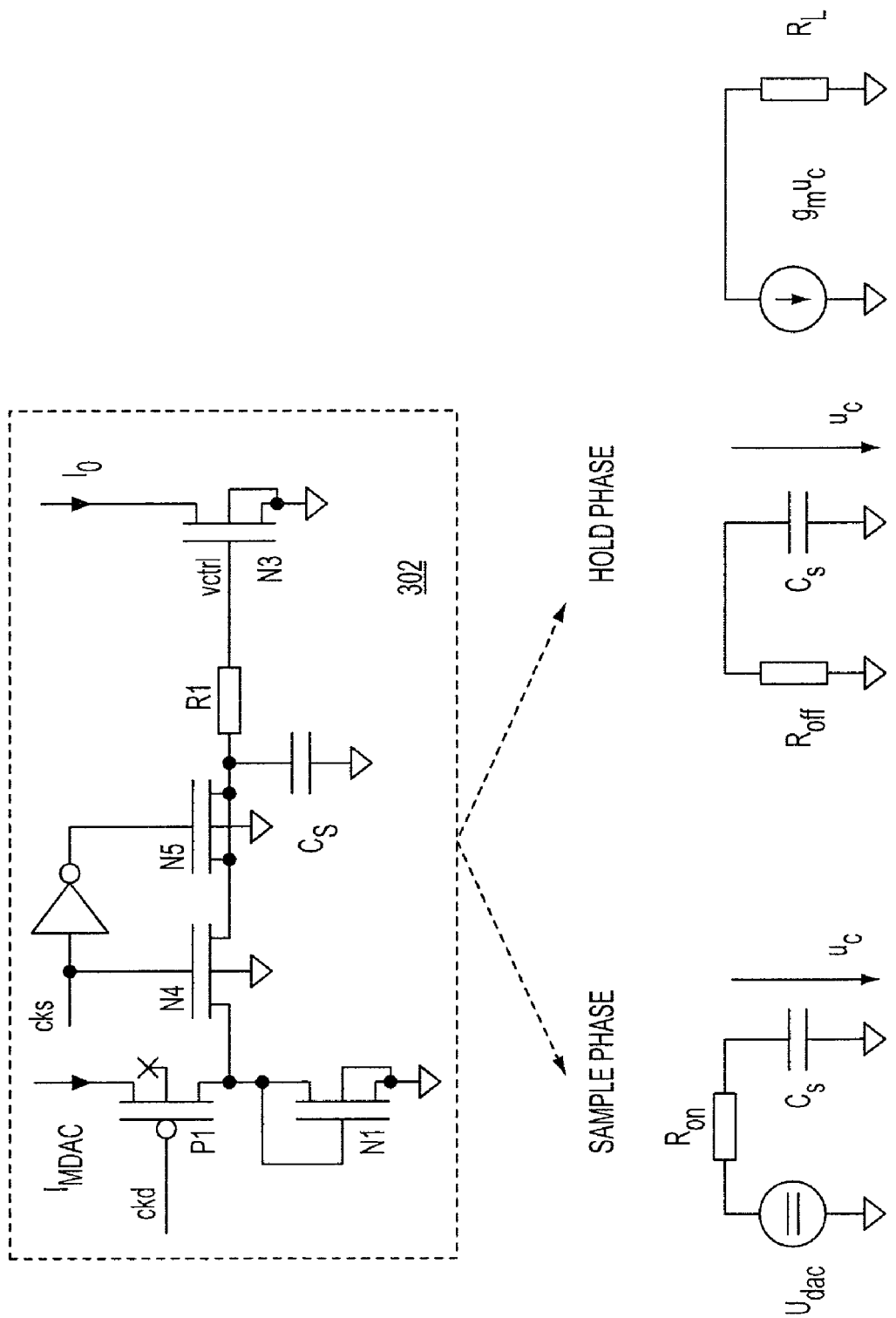
FIG. 4 is a diagram illustrating a slave DAC together with its equivalent circuits during the sample and hold phases that can be implemented within embodiments of the present invention.

FIG. 4 is a diagram illustrating a slave DAC together with its equivalent circuits during the sample and hold phases that can be implemented within embodiments of the present invention. According to an embodiment of the present invention, the operation of the SDAC 302 can be subdivided into a sample and a hold phase as shown in FIG. 4. During the sample phase, the switches P1 and N4 are turned on, whereas the short-circuited transistor N5 is turned off so that storage capacitor $C_s$ can charge or discharge to the voltage across the switched current mirror NI. During the hold phase, P1 and N4 are open whereas N5 is turned on. The charge on $C_s$ produces the control voltage $v_{ctrl}$ $$\left(\text{given by } v_{ctrl} = \frac{1}{C_s} \int I_{IMAC} dt\right)$$

that controls the SDAC's output current (given by $I_0 = g_m v_{ctrl}$) Additional details regarding the hold and sample phases will now be discussed below with reference to FIG. 5.

Figure 5:
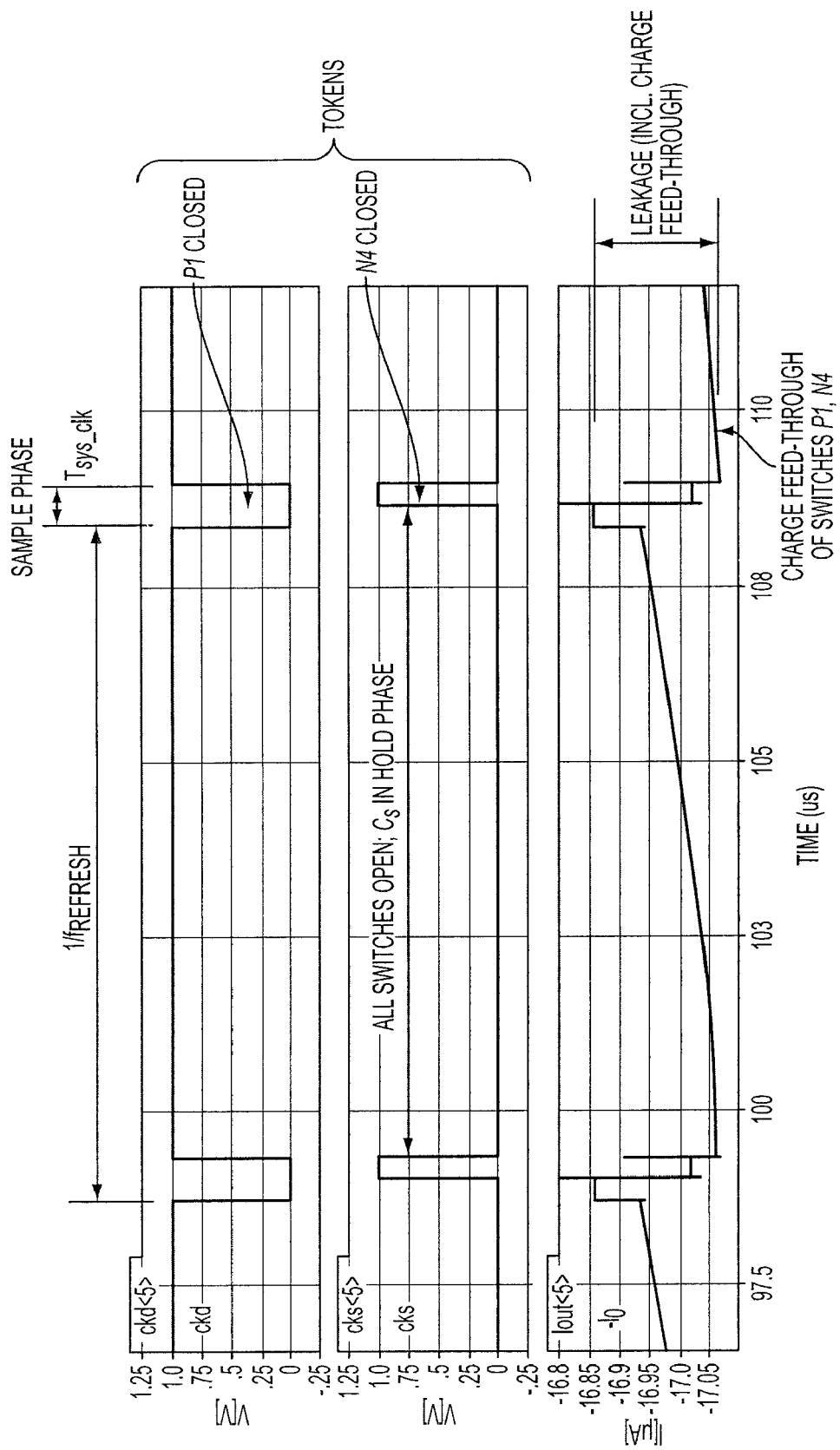
FIG. 5 is a timing diagram illustrating a plurality of token signals cks and ckd, respectively, and the output current $I_0$ for the sample and hold phases of the slave-DAC shown in FIG. 4 that can be implemented within embodiments of the present invention.

FIG. 5 is a diagram illustrating the timing diagram of token signals cks and ckd, respectively, and the output current $I_0$ for the sample and hold phases of the slave-DAC shown in FIG. 4 that can be implemented within embodiments of the present invention. As shown in FIG. 5, during the hold phase, the switches P1 and N4 are turned off and the storage capacitor $C_s$ is in hold phase. During the sample phase, the switches P1 and N4 are closed and a charge (according to $\int I_{MAC}^{dt}$) is fed through the switches P1 and N4. In contrast to the high-level schematic of FIG. 3 where only one token signal (e.g. s0) is fed to the SDAC 302, the token signal in FIG. 4 and FIG. 5 is split into the two signals cks and ckd. A more detailed illustration of the cks and ckd generation will be discussed below in reference to FIGS. 6A through 6C. The purpose for splitting up the token signal into the two signals cks and ckd is to prevent glitches and ripples occurring from setting the voltage across the diode-connected transistor N1 to a new value determined by $I_{MDAC}$. The token signal ckd is therefore active-low with a pulse width approximately twice as long as that of the high-active cks pulse that turns on switch N4. Moreover, the high-active pulse cks occurs in the second half of the low-active pulse ckd and hence the voltage across N1 can settle during the first half of the negative-going pulse ckd before switch N4 connects the voltage across switch P1 through to the storage capacitor $C_s$. During the subsequent hold phase, the voltage across $C_s$ drops due to leakage effects and hence the SDAC 302's output current $I_O$ drops as well. FIG. 5 shows the negative value of $I_O$ and therefore a current drop manifests as a rising curve. Once the current drop has exceeded a predetermined threshold (e.g. the current equivalent to 1 LSB of c<0:N−1>), the SDAC 302 is refreshed again and the sample phase repeats. According to an embodiment of the present invention, the periodicity of the refresh cycles is given by the length of the ring counter 304 and the frequency of the input clock sys_clk.

Based on these boundary conditions the lower limit for the system clock driving the ring counter can be approximated by $$f_{sys\_clk,min} = -\frac{M}{2\pi R_{off} C_s \ln(1 - 2^{-N})},$$

where $R_{off}$ is the equivalent off-resistance in the hold phase shown in FIG. 4, $C_s$ is the capacitance of the storage capacitor, and N is the resolution of the MDAC 301.

Figure 6A:
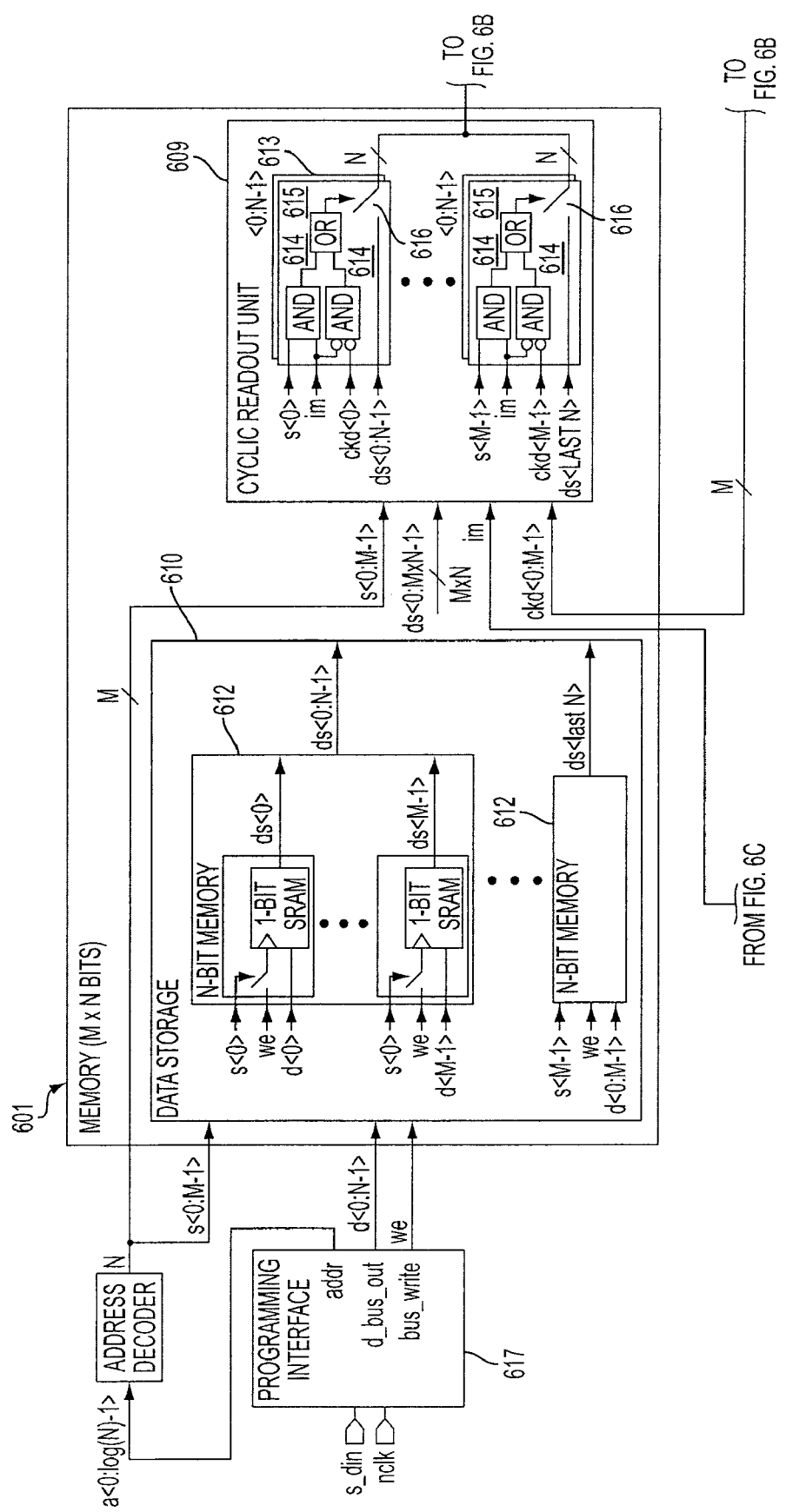
FIGS. 6A through 6C are diagrams illustrating a DAC and an implementation of the token generator and the memory block according to embodiments of the present invention.
Figure 6B:
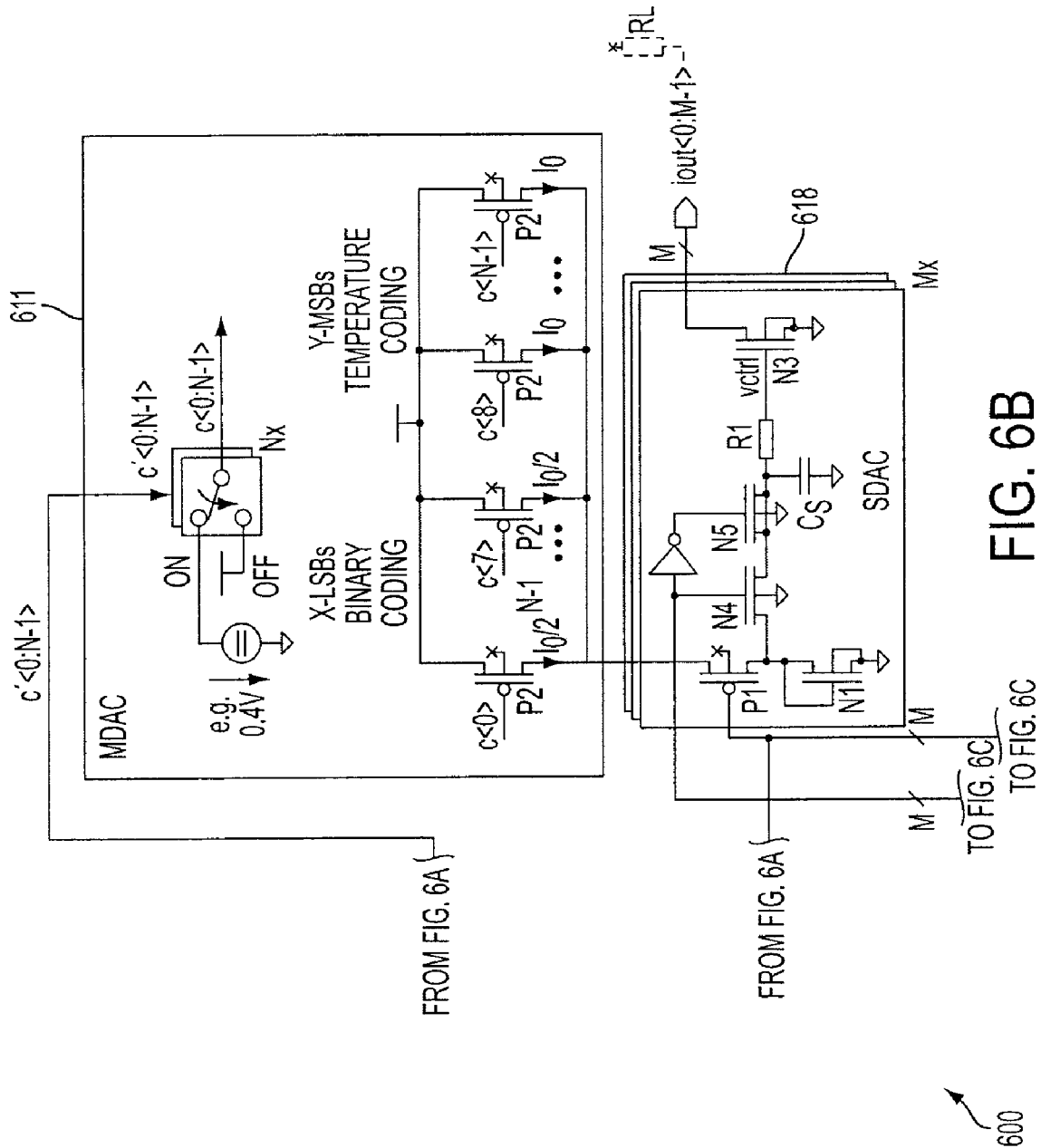
Figure 6C:
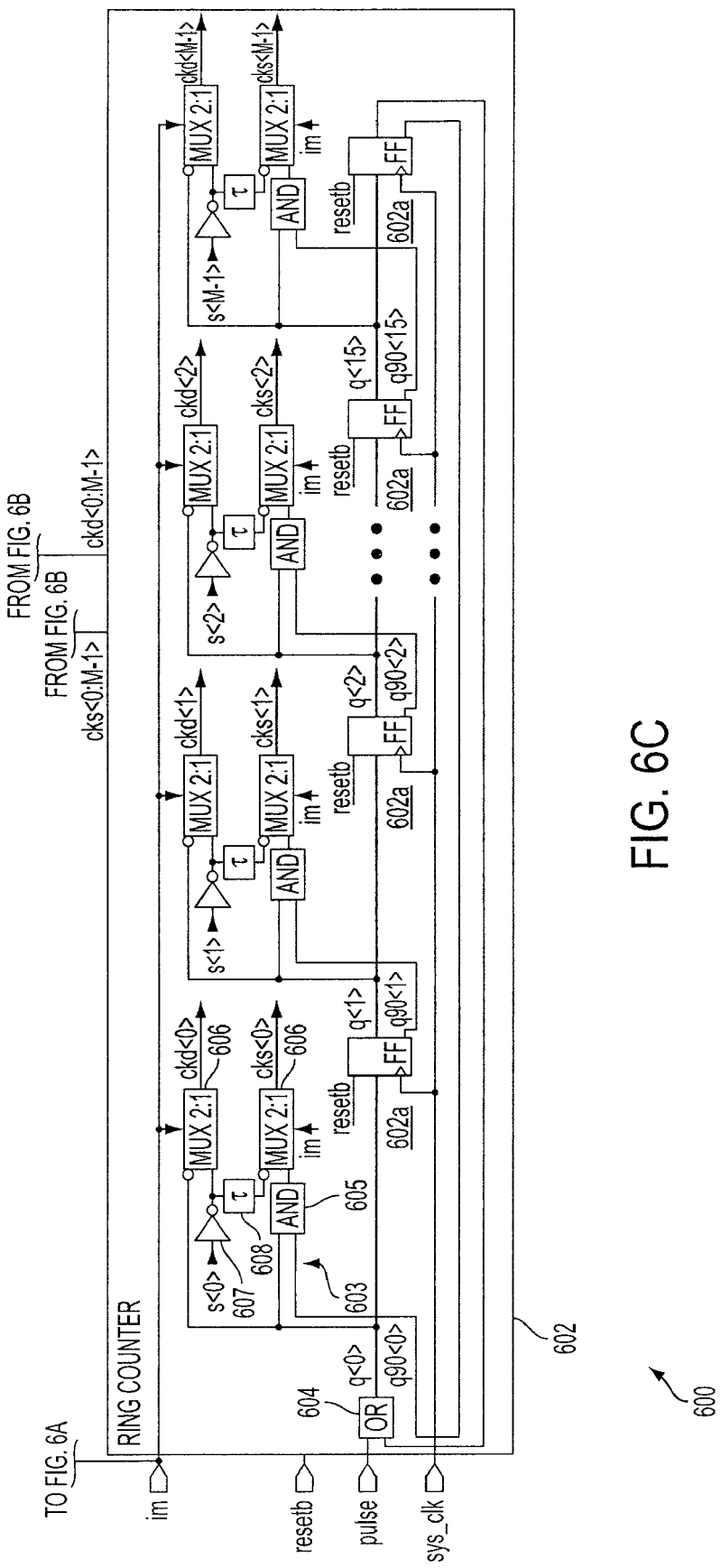

FIGS. 6A through 6C are diagrams illustrating a DAC 600 and an implementation of the ring counter and the memory block according to embodiments of the present invention. As shown in FIGS. 6A through 6C, a memory block 601 and a ring counter 602 are provided. According to an embodiment of the present invention, the memory block 601 may be a coefficient memory storing 16×12 bits, for example, for programming of a slave DAC. The memory block 601 includes a data storage 610 and a cyclic readout unit 609. Additional details regarding the memory block 601 will be discussed below.

Figure 7:
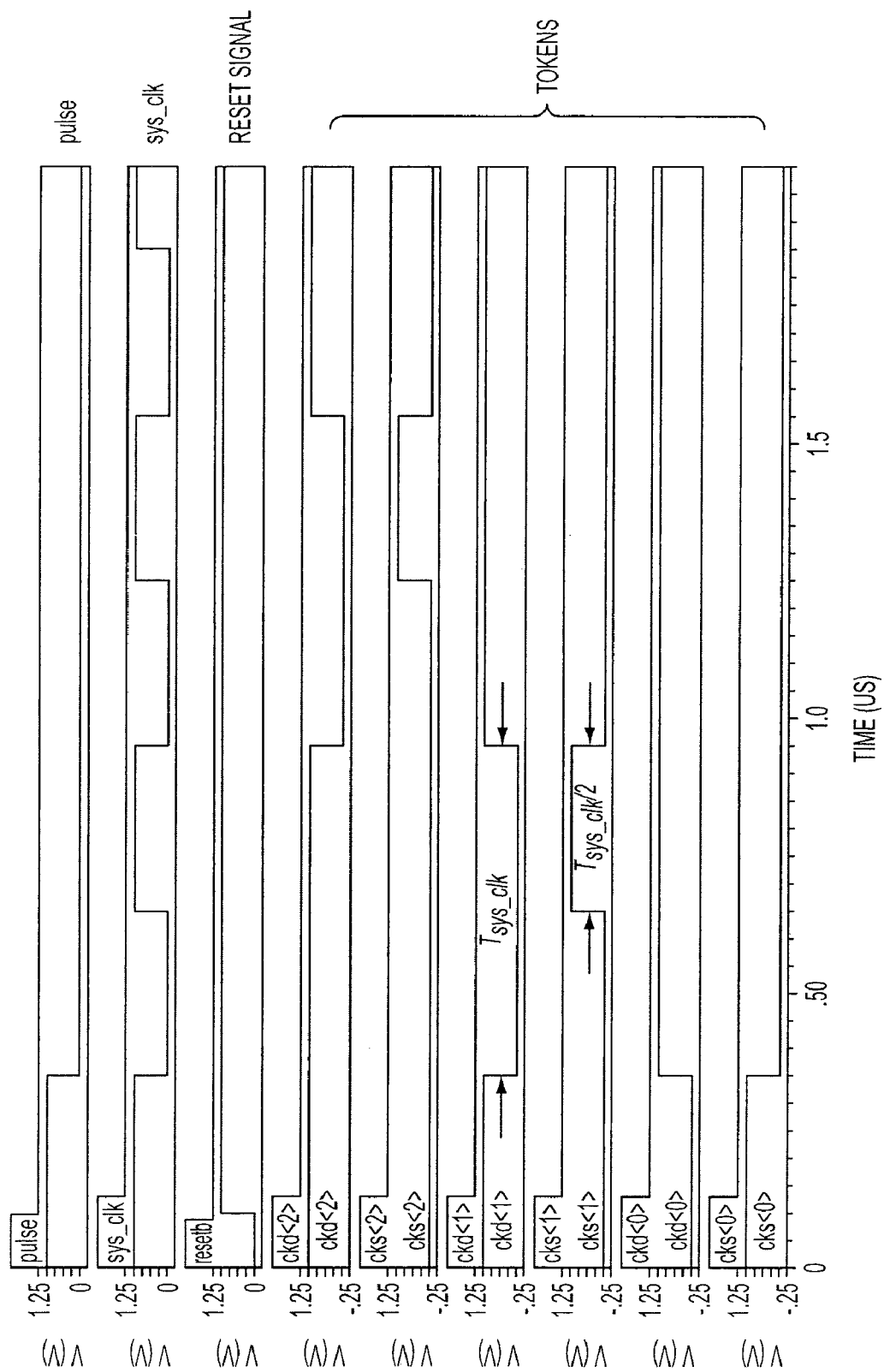
FIG. 7 is a timing diagram illustrating the initialization of the ring counter according to embodiments of the present invention.

According to an embodiment of the present invention, the ring counter 602 includes a ring of flip flops 602a with additional logic 603 connected to the in-phase (e.g. q<0>) and quarter-phase (e.g. q90<0>) outputs of the flip flops 602a. The ring counter 602 has the input signals im, resetb, pulse, and sys_clk and 2×M output signals cks<0:M−1> and ckd<0:M−1>, respectively. The startup sequence of the ring counter 602, which illustrates some of these inputs and outputs, will be discussed below with reference to FIG. 7 which is a timing diagram illustrating the initialization of the ring counter 602 according to embodiments of the present invention.

Further as shown in FIG. 6C, the input signal pulse includes an isolated pulse that is fed to an OR-gate 604 in the ring counter 602. Once that pulse appears at the output of the OR-gate 604, it will then propagate through the ring counter 602 at the speed of the system clock sys_clk as can be seen by the output signals cks<0> through ckd<2> in the timing diagram of FIG. 7. The signals cks and ckd are the tokens that select the SDACs 618 and the memory cells. To make sure that the flip-flops 602a of the ring counter 602 are initialized correctly, a low-active reset pulse resetb is applied at the beginning of the pulse-signal.

According to an embodiment of the present invention, the additional logic 603 at the flip flop 602 outputs includes an AND-gate 605, a pair of 2:1 multiplexers 606 and an inverter 607 with output delay 608. There are at least two operation modes including (a) regular periodic updates and (b) immediate updates. As shown in FIG. 6B, a MDAC 611 and a SDAC 618 are also provided. Additional details regarding the MDAC 611 and the SDAC 618 will be discussed below.

In the operation mode (a) the immediate update signal im is logical low and the multiplexers 606 switch the flip flop 602 outputs q<0:M−1> and q90<0>M−1> to the ring counter 602 outputs ckd<0:M−1> and cks<0:M−1>. In the case of cks<0:M−1>, the signals q90<0:M−1> are first AND-gated 605 with q0<0:M−1> to limit the quadrature-phase outputs to half of the ckd-pulse width (refer to FIG. 7). Note that q<0:M−1> is inverted in front of the 2:1-multiplexer 606 that provides the ckd-outputs.

In the operation mode (b) the immediate update signal im is logical high and the inputs derived from the address signal s<0:M−1> are selected by the multiplexers 606. The address signal s<0:M−1> is a vector with a single 1 within 0s. The position of the logical one determines the address in the memory. The inverter 607 verifies that the ckd-signals derived from the address signal is low-active, whereas the delay element 608 implemented as a set of cascaded inverters mimics the 90-degree phase shift used to generate the delayed relationship between ckd and cks so that these signals are similar to the signals in the operation mode (a). Additional details of the intermediate updates (i.e., operation mode (b)) will now be discussed below with reference to FIG. 8.

Figure 8:
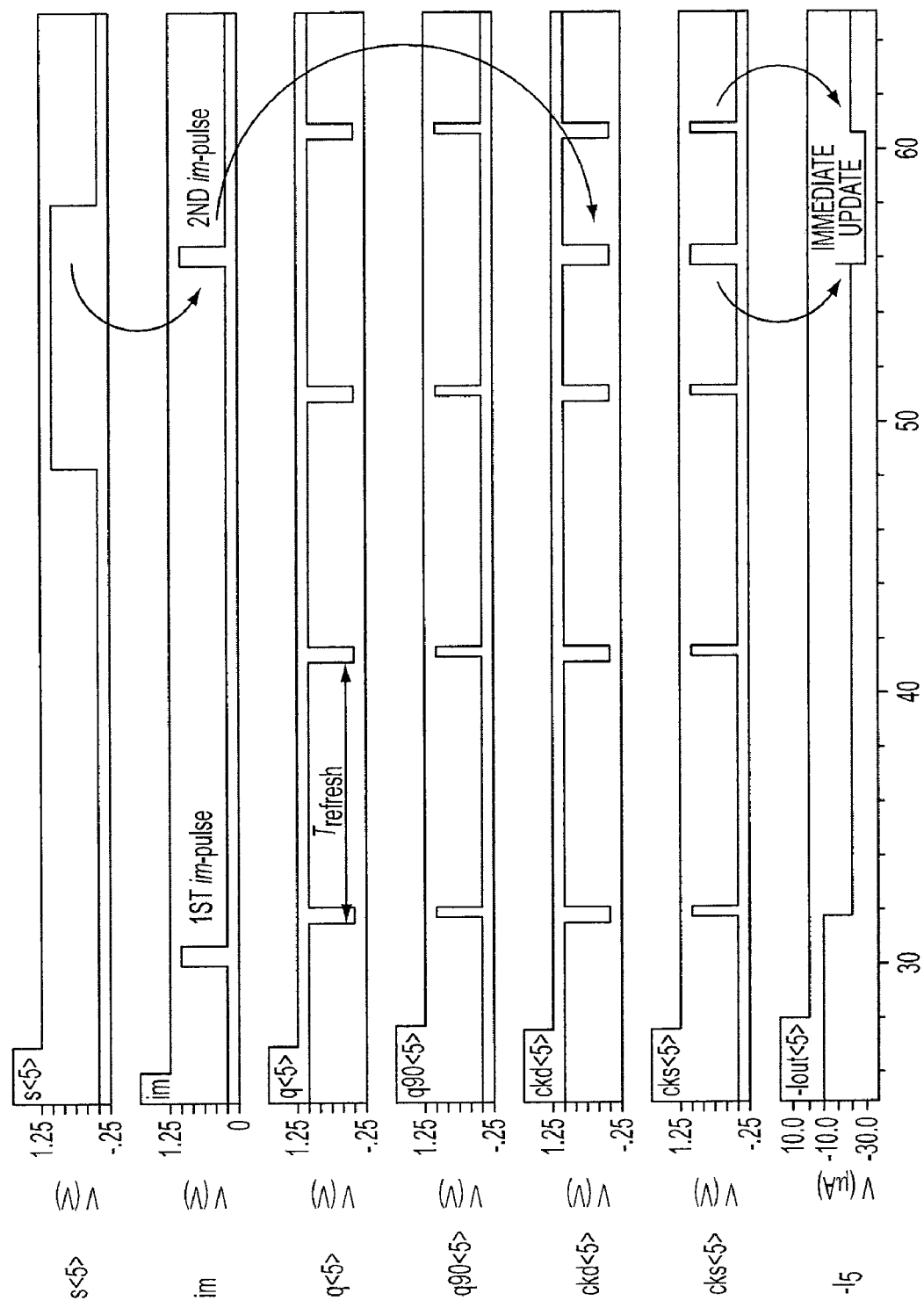
FIG. 8 is a timing diagram illustrating an operation of the immediate update function that can be implemented within embodiments of the present invention.

FIG. 8 is a timing diagram illustrating an operation of an immediate update that can be implemented within embodiments of the present invention. As shown in FIG. 8, the impact of the im-signal on the output current $I_5$ of the 5-th SDAC 618 is shown. There are two im-pulses. During the 1st im-pulse, the address bit s<5> is logical zero and hence the 5-th SDAC 618 is not selected for an immediate update. Right after the 1st im-pulse, a regular update cycle changes $I_5$ to a new value. At the occurrence of the $2^{nd}$ im-pulse s<5> is logical high, which means that the 5-th SDAC 618 is selected and assumes right after the assertion of the im-pulse the value stored in the memory cell for an immediate update of the specified SDAC 618. After im is logical 0 again, a new regular update cycle occurs, which changes $I_5$ again to assume a new value. As shown in FIG. 8, $I_5$ resumes the value it had before the $2^{nd}$ im-pulse has occurred. Note that in this timing diagram, the delay 608 is very small so that ckd and cks have approximately the same pulse widths when im is logical 1, which manifests in somewhat higher glitches in $I_5$. The timing diagram in FIG. 8 describes how the update logic 603 operates.

The token signal ckd<0:M−1> is also fed to the cyclic readout unit 609, which reads the N-bit wide data ds<0:N−1> from the data storage 610 and feeds it to the MDAC 611. Analogously to the ring counter 602, there are two operation modes (a) and (b) of the cyclic readout unit 609.

In the operation mode (a), where the immediate update signal im is 0, the cyclic readout unit 609 periodically reads N-bit-wide memory sub-blocks 612, one after the other according to where within the ckd<0>M−1>-vector the token has been propagated. To this end the cyclic readout unit 609 includes M identical logic blocks 613 each having N identical copies. Each logic block 613 includes two AND-gates 614, one having an inverted input, followed by an OR-gate 615 whose output controls a switch 616 that connects the currently selected memory data ds<0:N−1> to the input of the MDAC 611. Since each entity of the N logic blocks 613 is associated to 1 bit within the ckd<0:M−1>-vector, only one of the M logic blocks 613 is enabled at a time. According to an embodiment of the present invention, the logic blocks 613 implement a M×N matrix in which the logical 0 within ckd<0:M−1> selects the row that is to be connected to c'<0:N−1>.

In the operation mode (b), where the immediate update signal im is 1, the ckd<0:M−1>-vector is disabled by the corresponding AND-operation and the switches 616 are instead controlled by the logical one within the address vector s<0:M−1>. This time the logical 1 in s<0:M−1> selects in lieu of the logical 0 in ckd<0:M−1> the row in the M×N matrix that is to be connected to c'<0:N−1>. According to an embodiment of the present invention, the address vector s<0:M−1> is also used for the initialization of the memory via the programming interface 617. The signals s_din and nclk read data from an external device (e.g. a computer). This data is then successively written in quantities of N bits via d<0:N:1>, we (=write enable) and the address vector s<0:M−1> to the individual memory sub-blocks 612. Once this initial programming is performed, the MDAC 611 performs the periodic updates of the SDACs 618 based on the ring counter 602 and the cyclic readout unit 609. If an immediate update of a specified SDAC 618 needs to be performed, the immediate update signal im must be asserted and the address vector s<0:M−1> selects the data in the memory as well as the pertinent SDAC 618 cell that is to be updated immediately. A description of the operation of the DAC according to an embodiment of the present invention will now be described below with reference to FIG. 9.

Figure 9:
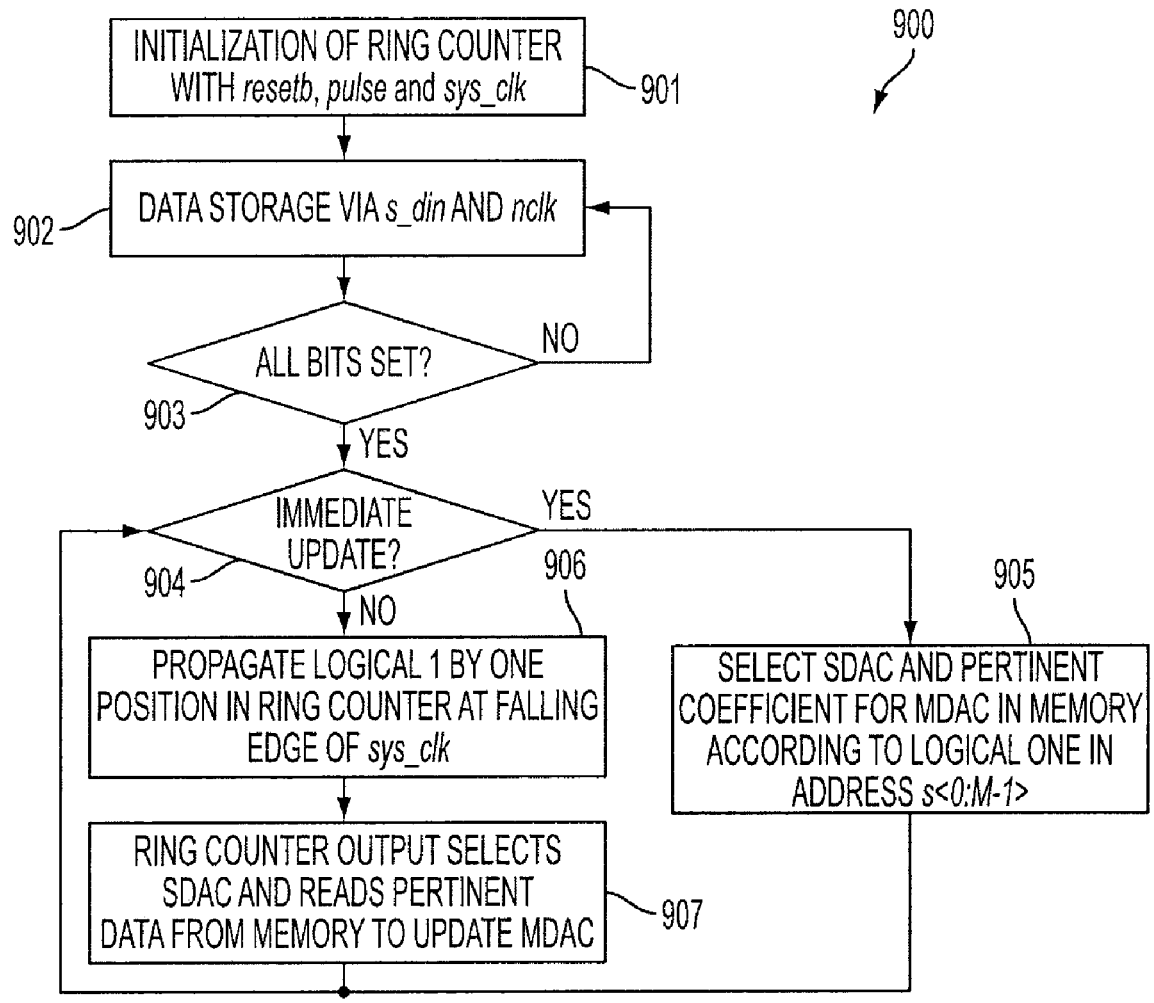
FIG. 9 is a flow chart illustrating an operation of the DAC shown in FIG. 3 according to embodiments of the present invention.

FIG. 9 is a flow chart 900 illustrating an operation of the DAC shown in FIG. 3 according to embodiments of the present invention. In operation 901, the ring counter 602 is initialized with input signals resetb, pulse and sys_clk. Next, in operation 902, the data storage is initialized using signals s_din and nclk via the programming interface 617. In operation 903 it is determined whether all bits area set. If not, the process returns to operation 902. If yes, then the process continues to operation 904 where it is determined whether an immediate update needs to be performed. If yes, the process moves to operation 905 where the SDAC and the pertinent memory cell are selected according to the address vector 905. If no immediate update is needed, the process continues to operation 906 where a logical 1 is propagated by one position in the ring counter at a falling edge of the clock signal sys_clk and the process continues to operation 907 where the ring counter output selects the SDAC and reads pertinent data from memory to update the MDAC. That is, the ring counter output periodically selects the SDAC together with the associated data in the memory and regenerates the charges lost on the storage capacitors by leakage.

Embodiments of the present invention provide a DAC that enables the dynamic operation of the SDACs and allows a small-area and low-complexity implementation of the individual SDAC cells. As mentioned, a single SDAC cell includes a current-mirror with switch transistors in combination with a storage capacitor, which is preferably implemented as deep-trench capacitor. Deep-trench capacitors are produced via deep reactive-ion etching and are typically used in dynamic-random-access-memories (DRAMs) where high-density storage capacitors are required.

Compared to a typical static DAC, the SDAC according to an embodiment of the present invention has two advantages. First, its area does not scale with the resolution as opposed to a static DAC whose area doubles with every additional bit of resolution if its weights are binary coded. This is due to the SDAC receiving a current that leads to the proportional accumulation of charges on a storage capacitor, which in turn helps produce the desired analog output of the SDAC. Further, the granularity or resolution of the distributed current is adjusted only in the MDAC and hence the SDAC becomes independent of the overall DAC resolution. Similar to a typical static DAC, the MDAC scales with the resolution. But since there is only one MDAC driving a plurality of SDACs, the area increase due to an increase of resolution becomes smaller the higher the number of SDACs. This is in contrast to a typical architecture where all DACs are equal and every static DAC contributes to the area increase.

Another advantage of the present invention is related to the programming of the DACs. While static, binary coded DACs need N digital control lines according to the resolution of $2^{-N}$, SDACs can be operated with only two control lines, namely one analog signal that feeds the current for the charge accumulation on the storage capacitor and one digital signal that carries the token for the selection of the individual DACs. The difference in the number of programming lines between a typical static DAC and the SDAC in the present invention results in a significant area gain. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A digital-to-analog converter comprising;
a plurality of dynamically operated slave digital-to-analog converters, each comprising a switched current mirror and a storage capacitor; and
a static master digital-to-analog converter in communication with the plurality of dynamically operated slave digital-to-analog converters, the static master digital-to-analog converter is operable to distribute a current to at least one of the plurality of slave digital-to-analog converters such that voltage across the storage capacitor of the at least one slave digital-to-analog converter controls the switch current mirror so that the at least one slave digital-to-analog converter outputs currents that are equivalent to digital codes applied to the static master digital-to-analog converter.

2. The digital-to-analog converter of claim 1, wherein the current from the static master digital-to-analog converter is periodically distributed to the at least one slave digital-to-analog converter to compensate for charge leakage on the storage capacitor of the at least one slave digital-to-analog converter.

3. The digital-to-analog converter of claim 2, further comprising:
a ring counter in communication with the static master digital-to-analog converter and the plurality of slave digital-to-analog converters, which is operable to control the static master digital-to-analog converter and the slave digital-to-analog converters.

4. The digital-to-analog converter of claim 3, wherein the ring counter is further operable to schedule periodic updates of the plurality of the slave digital-to-analog converters, and to select data from a data memory and a specified slave digital-to-analog converter of the plurality of digital-to-analog converters to be updated.

5. The digital-to-analog converter of claim 2, wherein the current distributed from the static master digital-to-analog converter is periodically distributed to a specified slave digital-to-analog converter of the plurality of slave digital-to-analog converters based on a request for an immediate update of the specified slave digital-to-analog converter.

6. The digital-to-analog converter of claim 5, wherein the data memory comprises a data storage and a cyclic readout unit, wherein a periodic update of the plurality of slave digital-to-analog converters is performed based on additional logic in the ring counter and the cyclic readout unit of the data memory.

7. The digital-to-analog converter of claim 3, wherein the ring counter is a token generator and includes one or more output signals per delay stage; and
wherein the output signals act as tokens to select the slave digital-to-analog converters and sub-blocks of the data memory according to a token position of a token within the plurality of ring counter outputs.

8. The digital-to-analog converter of claim 7, wherein the ring counter and cyclic readout unit each include logic circuits including AND-gates, OR-gates, inverters, and multiplexers; and wherein the logic circuit is operable to feed the processed token signals to the static master digital-to-analog converter and the plurality of slave digital-to-analog converters and to allow an immediate update signal received from an end user to directly access a specified slave digital-to-analog converter and a sub-block of the data memory so that the tokens from the ring counter are bypassed.

9. The digital-to-analog converter of claim 6,
wherein in the cyclic readout unit data is organized as M×N matrix with M being a number of the plurality of slave digital-to-analog converters and N being a resolution of the static master digital-to-analog converter; and
wherein each row of the M×N matrix can either be accessed via the tokens from the ring counter or via an immediate update signal in conjunction with an address vector used for an initialization of the data memory.

10. A method for performing digital-to-analog conversion via a digital-to-analog converter, the method comprising:
providing a plurality of dynamically operated slave digital-to-analog converters, each comprising a switched current mirror and a storage capacitor;
providing a static master digital-to-analog converter in communication with the plurality of dynamically operated slave digital-to-analog converters,
initializing a ring counter in communication with the plurality of dynamically operated slave digital-to-analog converters and the static master digital-to-analog converter;
initializing a data memory via a programming interface; and
distributing a current to at least one of the plurality of slave digital-to-analog converters such that voltage across the storage capacitor of the at least one slave digital-to-analog converter controls the switch current mirror such that the at least one slave digital-to-analog converter outputs currents that are equivalent to digital codes applied to the static master digital-to-analog converter.

11. The method of claim 10, further comprising:
determining whether an immediate update needs to be performed on any of the plurality of slave digital-to-analog converters and performing the immediate update on a specified slave digital-to-analog converter and an associated memory cell; and
performing periodic updates to the plurality of slave digital-to-analog converters by periodically distributing current to at least one slave digital-to-analog converter to compensate for charge leakage on the storage capacitor of the at least one slave digital-to-analog converter.

12. The method of claim 11, wherein scheduling of the periodic updates and selecting data from a data memory and a specified slave digital-to-analog converter of the plurality of digital-to-analog converters to be updated is performed via the ring counter.

13. The method of claim 11, wherein the current distributed from the static master digital-to-analog converter is periodically distributed to a specified slave digital-to-analog converter of the plurality of slave digital-to-analog converters based on a request for an immediate update of the specified slave digital-to-analog converter.

14. The method of claim 13, wherein the data memory comprises a data storage and a cyclic readout unit, wherein a periodic update of the plurality of slave digital-to-analog converters is performed based on additional logic in the ring counter and the cyclic readout unit of the data memory.

15. The method of claim 14, further comprising:
generating output signals from the ring counter that act as tokens to select the slave digital-to-analog converters and sub-blocks of the data memory according to a token position of a token within the plurality of ring counter outputs.

16. The method of claim 15, further comprising:
feeding processed token signals to the static master digital-to-analog converter and the plurality of slave digital-to-analog converters; and
allowing an immediate update signal received from an end user to directly access a specified slave digital-to-analog converter and a sub-block of the data memory so that tokens from the ring counter are bypassed.

* * * * *